(12) United States Patent
Lin et al.

(10) Patent No.: US 11,161,252 B2
(45) Date of Patent: Nov. 2, 2021

(54) MULTI-TASKING END EFFECTOR

(71) Applicant: GM Global Technology Operations LLC, Detroit, MI (US)

(72) Inventors: Yhu-tin Lin, Rochester Hills, MI (US); Erik B Golm, Warren, MI (US); Charles W McClure, White Lake, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 230 days.

(21) Appl. No.: 16/590,750

(22) Filed: Oct. 2, 2019

(65) Prior Publication Data

US 2021/0101294 A1 Apr. 8, 2021

(51) Int. Cl.
| | |
|---|---|
| B25J 15/00 | (2006.01) |
| H01M 50/50 | (2021.01) |
| H01M 50/00 | (2021.01) |
| H01M 10/04 | (2006.01) |
| H01M 10/42 | (2006.01) |
| B25J 15/06 | (2006.01) |

(52) U.S. Cl.
CPC ....... *B25J 15/0066* (2013.01); *B25J 15/0057* (2013.01); *B25J 15/0616* (2013.01); *H01M 10/04* (2013.01); *H01M 10/4285* (2013.01); *H01M 50/00* (2021.01); *H01M 50/50* (2021.01)

(58) Field of Classification Search
None
See application file for complete search history.

(56) References Cited

U.S. PATENT DOCUMENTS

| | | | | |
|---|---|---|---|---|
| 4,172,376 | A * | 10/1979 | Sassak | B21D 7/12 72/306 |
| 2012/0061981 | A1 * | 3/2012 | Motonaga | B25J 15/0004 294/213 |
| 2014/0102239 | A1 * | 4/2014 | Umeno | B25J 15/0038 74/490.01 |
| 2019/0127087 | A1 * | 5/2019 | Chungbin | B29C 63/0073 |
| 2019/0366426 | A1 * | 12/2019 | Wang | B25J 11/0085 |
| 2021/0078742 | A1 * | 3/2021 | Hashimoto | B65B 5/08 |

* cited by examiner

*Primary Examiner* — Gerald McClain

(57) ABSTRACT

A multi-tasking end effector system includes a base frame connected to a robot arm of a robot. A first shaft is rotatably supported on the base frame. A first pin-wheel assembly is rotatably mounted to the shaft at a first end of the base frame. Multiple first die assemblies are mounted to the first pin-wheel assembly. A second pin-wheel assembly is rotatably mounted to the shaft at a second end of the base frame. Multiple second die assemblies are mounted to the second pin-wheel assembly and individually oriented in mirror image configuration to one of the multiple first die assemblies. An index motor rotates the first shaft and co-rotates paired and mirror image die assemblies. First and second tab-bending actuators mounted to the base frame are operated to bend opposed cell tabs of a battery cell positioned between the first and second pin-wheel assemblies.

19 Claims, 7 Drawing Sheets

MULTI-TASKING END EFFECTOR

INTRODUCTION

The present disclosure relates to battery cell preparation for electric automobile vehicle battery modules.

In battery module stacking, battery cell preparation is the most capital intensive and floor space occupying portion of the process. Battery cell tabs are commonly bent to different geometries to provide battery cell stacking which permits electrically coupling the battery cell tabs. These operations are commonly conducted in multiple stages and require multiple different machines. Each battery cell must first be tested to confirm an open circuit voltage requirement is met before the battery cell tabs are bent for coupling. Traditionally, the multiple stages require the battery cells to be picked, tested, moved or placed into one of different machines, monitored for accuracy after each stage, and then moved to the next stage. The requirement for multiple different machines entails substantial floor space, investment and time to build and maintain. To tackle uncertain market demands of electric vehicles and to reduce production costs, a scalable, low-cost battery assembly system that can run on a substantially reduced number of machine stations and footprint of production lines would be a great challenge using the present manufacturing technology.

Thus, while current methods of battery cell preparation for electric automobile vehicle battery modules achieves their intended purpose, there is a need for a new and improved end effector system that can handle the operations of multiple different machines simultaneously to reduce production investment and floor space for a scalable and economical battery assembly system.

SUMMARY

According to several aspects, a multi-tasking end effector system includes a base frame. A first pin-wheel assembly is rotatably mounted on a first end of the base frame. A first die assembly is mounted to the first pin-wheel assembly. A second pin-wheel assembly is rotatably mounted on a second end of the base frame. A second die assembly is mounted to the second pin-wheel assembly, and is oriented in mirror image configuration with respect to the first die assembly. First and second tab-bending actuators are mounted to the base frame and operated to bend opposed cell tabs of a battery cell releasably positioned between the first pin-wheel assembly and the second pin-wheel assembly.

In another aspect of the present disclosure, a third die assembly is mounted to the first pin-wheel assembly; and a fourth die assembly is mounted to the second pin-wheel assembly, with the third die assembly oriented in mirror image configuration with respect to the fourth die assembly.

In another aspect of the present disclosure, a shaft is rotatably mounted to the base frame and connects the first pin-wheel assembly and the second pin-wheel assembly.

In another aspect of the present disclosure, an index motor is coupled to the shaft, the index motor rotating the shaft to co-rotate the mirror image configured die assemblies including the first and second die assemblies and the third and fourth die assemblies with respect to a shaft axis of rotation.

In another aspect of the present disclosure, first and second compression springs are positioned on the shaft oppositely with respect to the index motor, the first compression spring acting to bias the first pin-wheel assembly toward the index motor, and the second compression spring acting to bias the second pin-wheel assembly toward the index motor opposite to a direction of force applied by the first compression spring.

In another aspect of the present disclosure, a first cell positioner is mounted to the base frame and positioned proximate to the first pin-wheel assembly, and a second cell positioner is mounted to the base frame and positioned proximate to the second pin-wheel assembly.

In another aspect of the present disclosure, a first vacuum cup is connected to the first cell positioner and a second vacuum cup is connected to the second cell positioner. When a partial vacuum pressure is applied the first vacuum cup and the second vacuum cup provide vacuum lifting capability to temporarily attach to and retain the battery cell.

In another aspect of the present disclosure, the first pin-wheel assembly and the second pin-wheel assembly individually include a tab-bending die set attached to a hub having a fixed die fastened to an arm structure of the hub and a matching moving die. An open circuit voltage (OCV) sensor provides an open circuit voltage of the battery cell. The OCV sensor is mounted to one of: the tab-bending die set to provide the open circuit voltage during bending of the opposed cell tabs; or on a vacuum cup and positioned proximate to one of the opposed cell tabs using an OCV sensor holder to provide the open circuit voltage during battery cell loading In another aspect of the present disclosure, a tab-bending actuator pneumatically actuated to open and close the tab-bending die set at a tab bending position. An anvil is supported on the tab-bending actuator. A swing arm is provided, wherein to perform tab bending at the tab bending position, the swing arm rotates from a swing arm released orientation to a swing arm closed orientation acting to squeeze the tab-bending die set against the anvil.

In another aspect of the present disclosure, the first pin-wheel assembly and the second pin-wheel assembly individually include a die assembly having an individual tab-bending actuator and a die set having a fixed die and a moving die that swings and then squeezes toward the fixed die to bend the opposed cell tabs against the fixed die, the moving die thereafter separating from and swinging out and away from the fixed die to release the cell tabs.

According to several aspects, a multi-tasking end effector system includes a base frame connected to a robot arm of a robot. A first shaft is rotatably supported on the base frame. A first pin-wheel assembly is rotatably mounted to the first shaft at a first end of the base frame. Multiple first die assemblies are mounted to the first pin-wheel assembly. A second pin-wheel assembly is rotatably mounted to the shaft at a second end of the base frame. Multiple second die assemblies are mounted to the second pin-wheel assembly, and individually oriented in mirror image configuration with respect to one of the multiple first die assemblies. A first index motor rotates the first shaft and co-rotates paired and mirror image configuration ones of the die assemblies. First and second tab-bending actuators are mounted to the base frame and are operated to bend opposed cell tabs of a battery cell releasably positioned between the first pin-wheel assembly and the second pin-wheel assembly.

In another aspect of the present disclosure, a first die set is connected to one of the first die assemblies. A second die set is connected to one of the second die assemblies. An open circuit voltage (OCV) sensor is installed in the first die set and the second die set providing an open circuit voltage of the battery cell to be sensed during bending of the cell tabs.

In another aspect of the present disclosure, a first tab-bending actuator is pneumatically actuated to open or close the first die set at a first tab bending position; and a second tab-bending actuator is pneumatically actuated to open or close the second die set at a second tab bending position.

In another aspect of the present disclosure, a first cell positioner is mounted to the base frame and positioned proximate to the first pin-wheel assembly. A second cell positioner is mounted to the base frame and positioned proximate to the second pin-wheel assembly. The first cell positioner has a first vacuum cup, and the second cell positioner has a second vacuum cup. The first vacuum cup and the second vacuum cup when contacting the battery cell and when applied with a partial vacuum pressure provide vacuum lifting capability to temporarily attach to and retain the battery cell.

In another aspect of the present disclosure, a first wheel positioner is mounted to the base frame and positioned proximate to the first pin-wheel assembly and operates to linearly displace the first pin-wheel assembly. A second wheel positioner is positioned proximate to the second pin-wheel assembly and operates to linearly displace the second pin-wheel assembly.

In another aspect of the present disclosure, a third pin-wheel assembly is paired with a fourth pin-wheel assembly on a second shaft, the third pin-wheel assembly and the fourth pin-wheel assembly individually having multiple die assemblies. A second motor is operated to rotate the second shaft, the third pin-wheel assembly and the fourth pin-wheel assembly.

In another aspect of the present disclosure, a fifth pin-wheel assembly is paired with a sixth pin-wheel assembly on a third shaft. The fifth pin-wheel assembly and the sixth pin-wheel assembly individually have multiple die assemblies. A third motor is operated to rotate the third shaft, the fifth pin-wheel assembly and the sixth pin-wheel assembly.

According to several aspects, a multi-tasking end effector system includes a base frame connected to a robot arm of a robot using an adapter plate. A first shaft is rotatably supported on the base frame. A first pin-wheel assembly is rotatably mounted to the shaft. Multiple first die assemblies are mounted to the first pin-wheel assemblies. A second pin-wheel assembly rotatably mounted to the shaft. Multiple second die assemblies are mounted to the second pin-wheel assembly and are individually oriented in mirror image configuration with respect to one of the multiple first die assemblies. A first index motor rotates the first shaft and co-rotates paired and mirror image configuration ones of the first die assemblies and the second die assemblies. A first three-position cell positioner is mounted to the base frame and is positioned proximate to the first pin-wheel assembly and provides for a battery cell retrieval/release from or to a storage unit, a battery cell partial positioning before or after tab bending and a battery cell full positioning for tab bending a first battery cell tab. A second three-position cell positioner is mounted to the base frame and is positioned proximate to the second pin-wheel assembly and provides for the battery cell retrieval/release from or to the storage unit, the battery cell partial positioning before or after tab bending and the battery cell full positioning for tab bending a second battery cell tab. The die assemblies individually include an open circuit voltage (OCV) sensor providing an open circuit voltage of the battery cell sensed during bending of the first battery cell tab and the second battery cell tab.

In another aspect of the present disclosure, a first tab-bending actuator is mounted to the base frame and operates to bend the first battery cell tab of the battery cell when positioned between the first pin-wheel assembly and the second pin-wheel assembly. A second tab-bending actuator is mounted to the base frame and is operated to bend the second battery cell tab of the battery cell when positioned between the first pin-wheel assembly and the second pin-wheel assembly.

In another aspect of the present disclosure, the first pin-wheel assembly is mounted to the shaft at a first end of the base frame. The second pin-wheel assembly is mounted to the shaft at a second end of the base frame opposite to the first end.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

The drawings described herein are for illustration purposes only and are not intended to limit the scope of the present disclosure in any way.

DETAILED DESCRIPTION

The following description is merely exemplary in nature and is not intended to limit the present disclosure, application, or uses.

Figure 1:
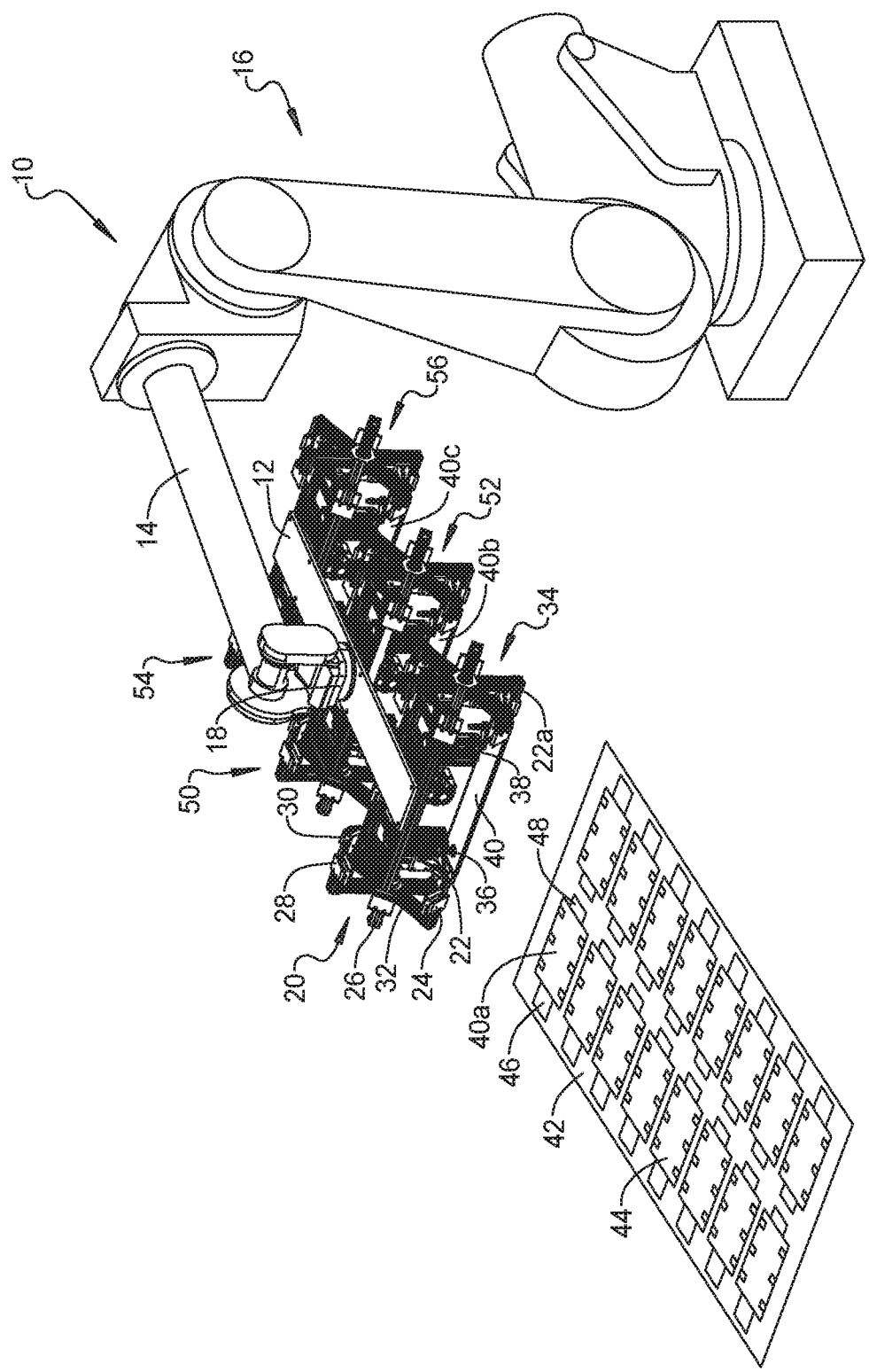
FIG. 1 is a front perspective view of a multi-tasking end effector system according to an exemplary aspect.

Referring to FIG. 1, a multiple tasking or multi-tasking end effector system 10 includes a base frame 12 that connects to a robot arm 14 of a robot 16 via an adapter plate 18. The end effector function in the multi-tasking end effector system 10 defines a device producing a desired change in an object such as by producing a bend or shape change in a battery cell tab. The multi-tasking end effector system 10 provides at least one pin-wheel assembly 20 rotatably mounted with respect to a first end of the base frame 12. Individual ones of the at least one first pin-wheel assembly 20 include at least one and according to several aspects six die assemblies 22, 24, 26, 28, 30, 32 positioned in equal angular intervals from successive ones of the die assemblies, with the die assembly 32 only partially visible in this view. Oppositely positioned and rotatably mounted with respect to a second end of the base frame 12 are at least one second pin-wheel assembly 34 having at least one and according to several aspects six die assemblies configured in mirror image aligned arrangements with respect to the six die assemblies 22, 24, 26, 28, 30, 32. For example a die assembly 22*a* is provided with the second pin-wheel assembly 34 which is aligned with and arranged in a mirror image configuration with respect to the die assembly 22 of the first pin-wheel assembly 20.

A first cell positioner 36 is mounted to the base frame 12 and is positioned proximate to the first pin-wheel assembly 20, and a second cell positioner 38 is mounted to the base frame 12 and is positioned proximate to the second pin-wheel assembly 34. The first cell positioner 36 and the second cell positioner 38 when provided with a partial vacuum pressure provide a vacuum lifting capability to temporarily attach to and retain a battery cell 40. The cell positioners provide three battery cell positions, for battery cell retrieval/release from or to a storage unit, for battery cell partial positioning before or after tab bending, and for full positioning for battery cell tab bending. Prior to operations performed by the multi-tasking end effector system 10, the individual battery cells such as a first battery cell 40*a* are retrieved from a battery dunnage unit 42 having multiple battery cells individually stored in one of multiple individual battery storage slots 44. The battery cells are retrieved from their predefined individual battery storage slots 44 in the battery dunnage unit 42 by preprogrammed operation of the robot 16 and use of the first cell positioner 36 and the second cell positioner 38 in the battery cell load position.

The battery cells such as the first battery cell 40*a* individually include a first cell tab 46 and an oppositely positioned second cell tab 48 which are modified such as by bending by operation of the multi-tasking end effector system 10 to reconfigure an orientation of the cell tabs to facilitate joining multiple battery cells into a vehicle battery assembly (not shown). Multiple battery cells such as a second battery cell 40*b* retained between a third pin-wheel assembly 50 and a fourth pin-wheel assembly 52, and a third battery cell 40*c* retained between a fifth pin-wheel assembly 54 and a sixth pin-wheel assembly 56 can simultaneously be temporarily held and modified by the multi-tasking end effector system 10.

Referring to FIG. 2 and again to FIG. 1, an exemplary paired configuration of the third pin-wheel assembly 50 and the fourth pin-wheel assembly 52 is presented. The pin-wheel assemblies are commonly configured, therefore the following discussion of the paired third pin-wheel assembly 50 and the fourth pin-wheel assembly 52 applies equally to the paired first pin-wheel assembly 20 and the second pin-wheel assembly 34, as well as to the paired fifth pin-wheel assembly 54 and the sixth pin-wheel assembly 56. The pairs of pin-wheel assemblies are commonly rotatably mounted on their own shaft 58 to which an independent index motor 60 is coupled. For example and with continuing reference to FIG. 1, the third pin-wheel assembly 50 is paired with the fourth pin-wheel assembly 52 on the shaft 58 and the fifth pin-wheel assembly 54 is paired with the sixth pin-wheel assembly 56 on the shaft 58.

The index motor 60 when energized rotates the shaft 58 which co-rotates paired ones of the die assemblies such as the die assemblies 22, 22*a* with respect to a shaft axis of rotation 62, positioning paired ones of the die assemblies to capture and bend the tabs of a battery cell. Compression springs are positioned to bias the pin-wheel assemblies toward the index motors. For example, a first compression spring 64 positioned outside of the third pin-wheel assembly 50 biases the third pin-wheel assembly 50 in a direction 66 toward the index motor 60, and a second compression spring 68 positioned outside of the fourth pin-wheel assembly 52 biases the fourth pin-wheel assembly 52 in a direction 70 which is opposite to the direction 66 and toward the index motor 60.

Also mounted on the base frame 12 are the first cell positioner 36 and the second cell positioner 38, a first wheel positioner 72 and a second wheel positioner 74, and a first tab-bending actuator 76 and a second tab-bending actuator 78. A first vacuum cup 80 is connected to the first cell positioner 36 and a second vacuum cup 82 is connected to the second cell positioner 38. The vacuum cups 80, 82 contact a face 84 of the battery cell 40*b* and when a partial vacuum pressure is applied to the vacuum cups 80, 82 the vacuum cups 80, 82 provide vacuum lifting capability to temporarily retain the battery cell 40*b* during operation of the multi-tasking end effector system 10.

Each pin-wheel assembly such as the third pin-wheel assembly 50 also includes a hub 86 and a tab-bending die set 88 attached to the hub 86 for each die assembly. Each tab-bending die set 88 of the pin-wheel assembly can provide the same or a different tab-bending die set. The plurality of tab-bending die sets provided with each of the pin-wheel assemblies can bend battery cell tabs such as the first cell tab 46 of the first battery cell 40*a* and the first cell tab 46 of the second battery cell 40*b* to the same or to different geometries to allow different positioning of the battery cells in a battery stack assembly. Each tab-bending die set such as the tab-bending die set 88 includes a fixed die 90 fastened to an arm structure of the hub such as the hub 86 and a matching moving die 92 that is coupled to the fixed die 90 via at least one spring-loaded guide pin 94 acting as a die set release to keep the fixed die 90 and the moving die 92 separated in free space when the die set is open to allow cell tab entrance while also providing a close shutting motion to bend the battery cell tab such as the first cell tab 46 when subjected to external compression.

The pin-wheel assembly such as the third pin-wheel assembly 50 and its die set such as the die set 88 can be moved toward or away from a desired tab bending position on the shaft 58 rotationally via the index motor 60 and linearly via the wheel positioner such as the first wheel positioner 72, plus a force provided by one of the compression springs such as the first compression spring 64 positioned proximate to the third pin-wheel assembly 50. A tab-bending actuator such as the first tab-bending actuator 76 is pneumatically actuated to either open or close the die set 88 at the tab bending position. During tab bending, a swing arm 96 rotates from a swing arm released orientation 96*a* shown to the right side of FIG. 2 to a swing arm closed orientation 96*b* shown on the left side of FIG. 2, which squeezes the die set 88 against an anvil 98 on the tab-bending actuator such as the first tab-bending actuator 76. After tab bending, the swing arm motion is reversed to open the die set 88 and ready the battery cell such as the battery cell 40*b* for unload.

Figure 2:
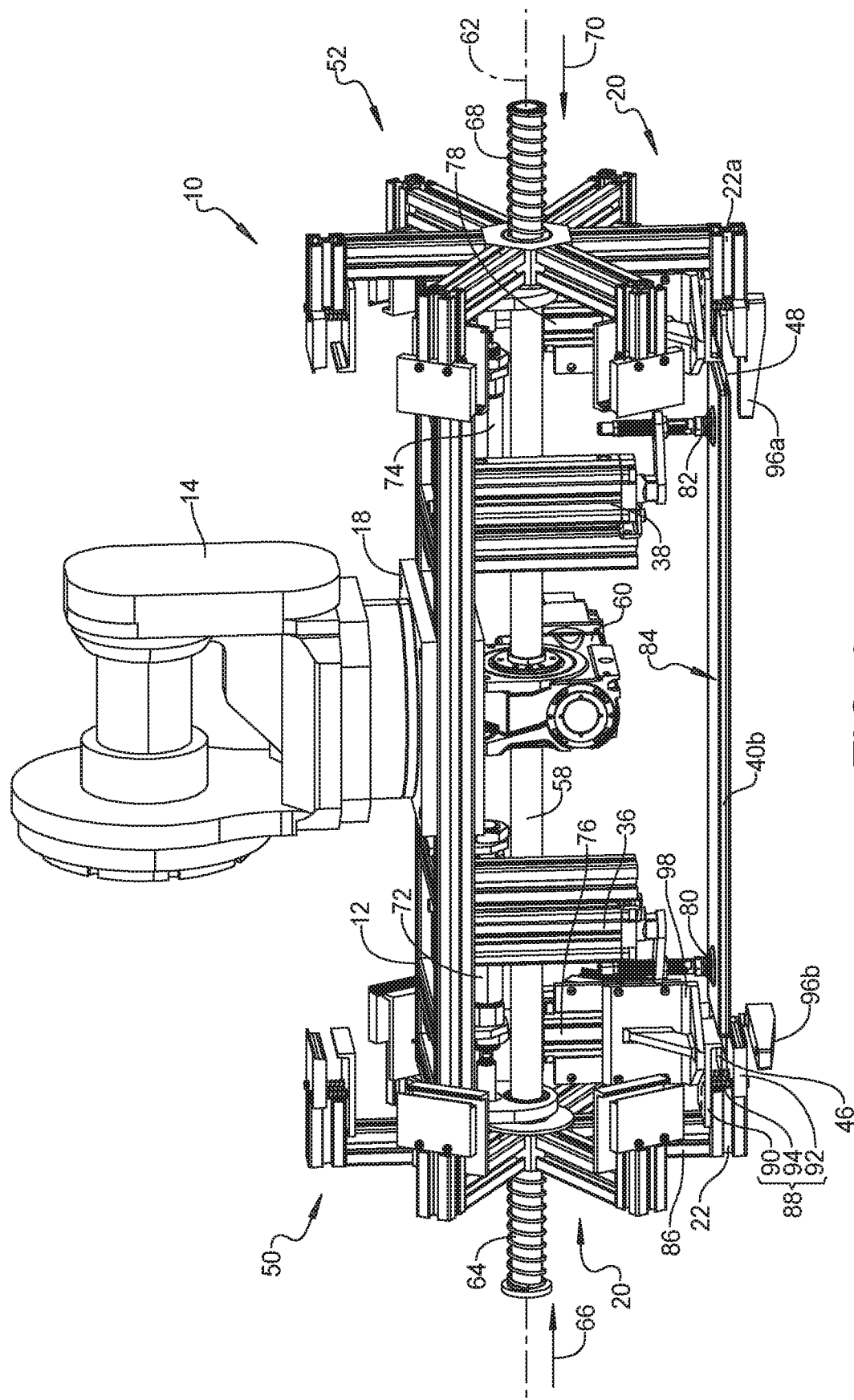
FIG. 2 is a front perspective view of a portion of the multi-tasking end effector system of FIG. 1.

Referring to FIGS. 3A and 3B and again to FIGS. 1 and 2, at a distal end of the swing arm 96 is a compression spring 100 which pre-loads a pre-clamp 102, standing proud of the moving die 92 in a free state. The distal end of the swing arm 96 is therefore the first component to press a tab root 104 of the battery tab 46 against the fixed die 90, which prevents a bending force from damaging the tab root 104. An open circuit voltage (OCV) sensor 106 can be installed in the multi-tasking end effector system 10, which includes a voltage meter 109 mounted on the base frame 12, an electric contact lead 107 on the anvil 98 and a spring-loaded touch head 108 protruding from a tab bend surface of the fixed die 90 such that together with a mirror image contact lead and touch head on the opposite side of the battery cell 40b, an open circuit voltage of the battery cell such as the battery cell 40b can be sensed at the same time of tab bending.

As previously noted, the multi-tasking end effector system 10 has at least one gripper or vacuum cup for loading/unloading battery cells. The vacuum cups are mounted on one of the cell positioners such as the first cell positioner 36 shown in FIG. 2 as a pneumatically operated three-position cylinder. The vacuum cups may be fully extended to retrieve/release a battery cell and fully retracted to position the battery cell for battery tab bending. The vacuum cups may be partially extended to an intermediate position after creating a battery tab Z-bend as shown in the arrangement of FIG. 3B and thereby provide clearance to allow the die set 88 to move away after battery tab bending. The same tab bending sequence and vacuum cup extension/retraction also apply to creating inverted V-bends (not shown) in the battery tabs.

Figure 3A:
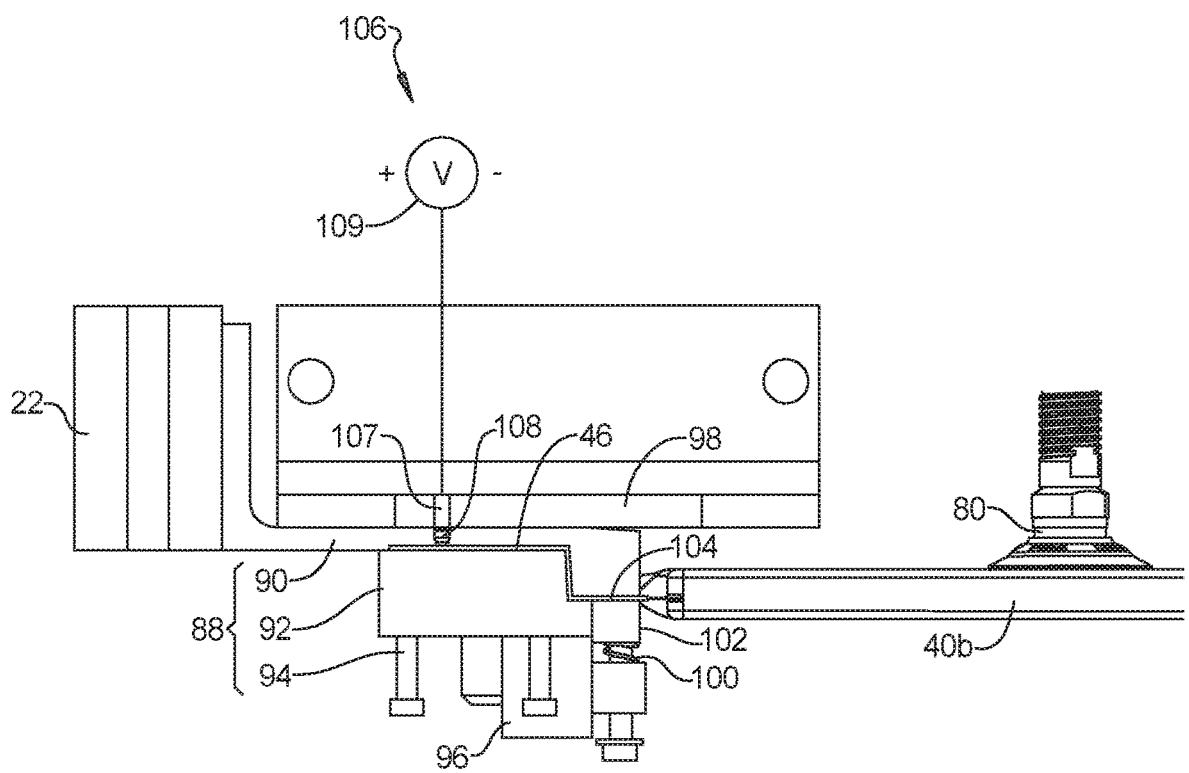
FIG. 3A is a side elevational view of a tab-bending die set for the multi-tasking end effector system of FIG. 1.
Figure 3B:
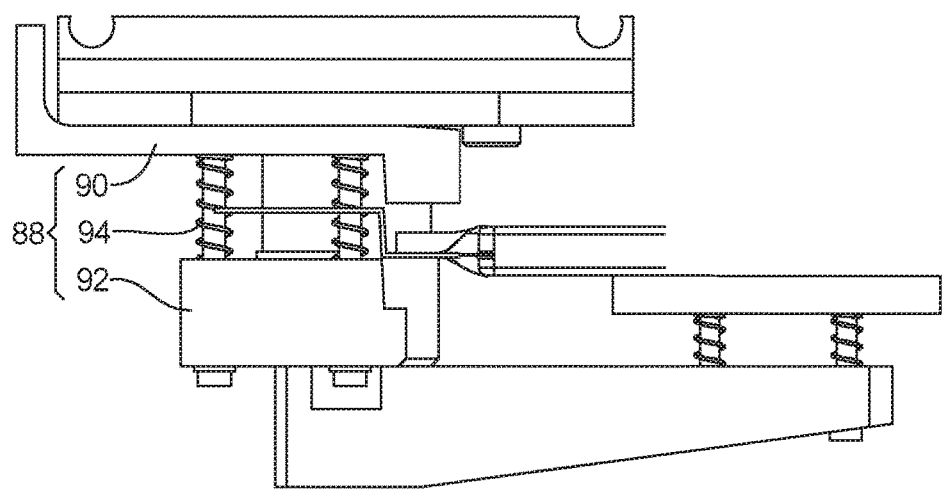
FIG. 3B is a side elevational view of a tab-bending die set for another aspect of the multi-tasking end effector system of FIG. 1.
Figure 4A:
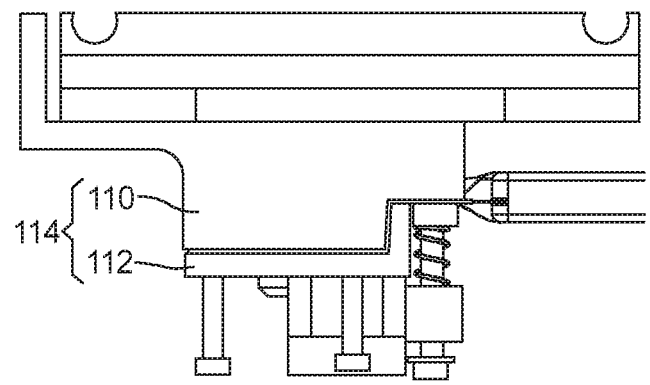
FIG. 4A is a side elevational view of another aspect of a tab-bending die set modified from FIG. 3A.
Figure 4B:
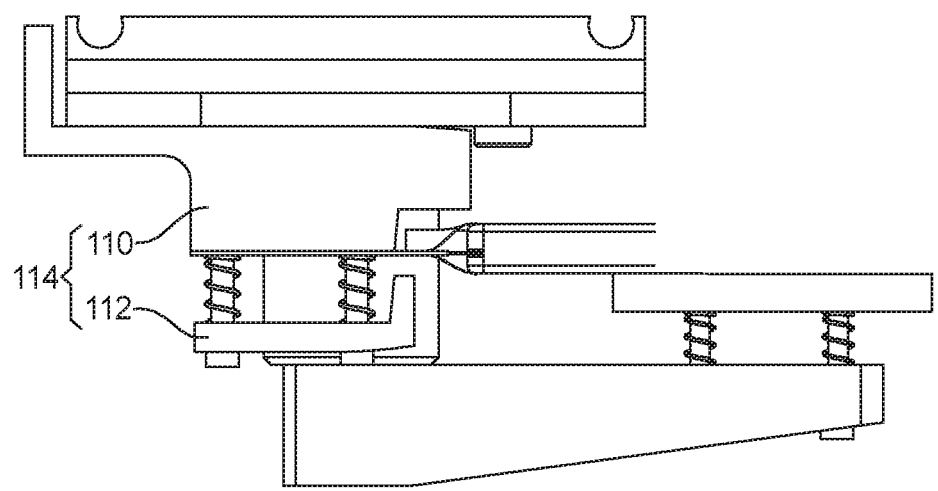
FIG. 4B is a side elevational view of another aspect of a tab-bending die set modified from FIG. 3B.

Referring to FIGS. 4A and 4B and again to FIGS. 3A and 3B, a fixed die 110 and a moving die 112 of a die set 114 can be used to create inverted Z-bends in the battery tabs. The first vacuum cup 80 shown and described in reference to FIG. 3B may be partially retracted to an intermediate position before creating the battery tab inverted Z-bend and thereby provide clearance to allow the die set 114 to move in as shown in FIG. 4B. After the move-in, the first vacuum cup 80 is fully retracted to position the battery cell 40b for battery tab bending. No partial extension of the first vacuum cup 80 or the battery cell 46b is needed to unload the battery cell 46b after completion of battery tab bending.

Figure 5A:
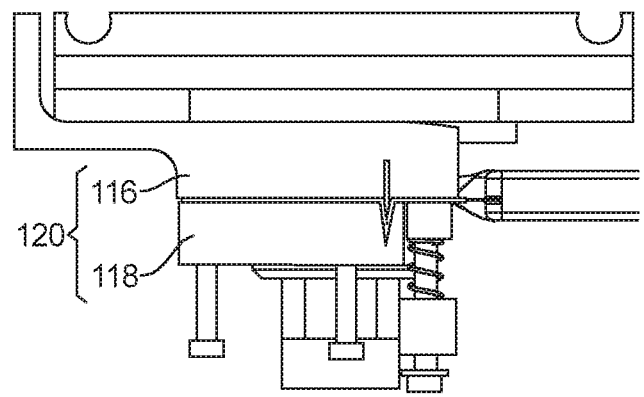
FIG. 5A is a side elevational view of another aspect of a tab-bending die set modified from FIG. 3A.
Figure 5B:
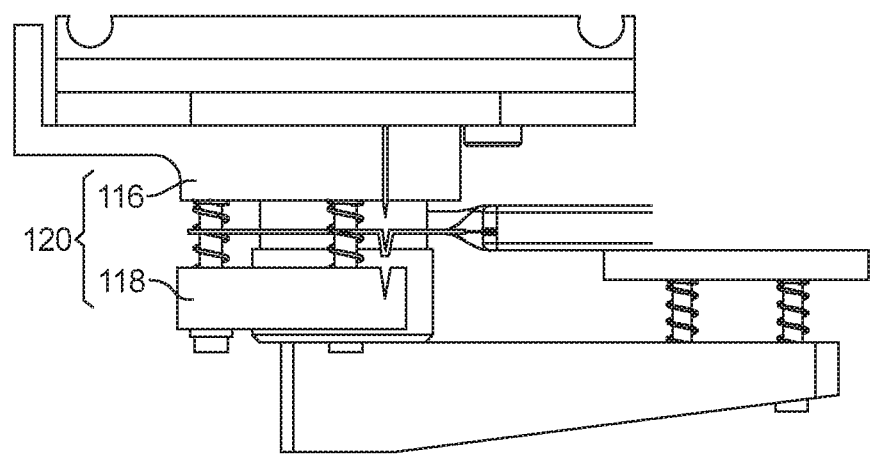
FIG. 5B is a side elevational view of another aspect of a tab-bending die set modified from FIG. 3B.

Referring to FIGS. 5A and 5B and again to FIGS. 3A and 3B, a fixed die 116 and a moving die 118 of a die set 120 can be used to create V-bends in the battery tabs. The first vacuum cup 80 may be partially retracted to an intermediate position before creating the battery tab V-bend and thereby provide clearance to allow the die set 120 to move in similar to the inverted Z-bend as shown in FIG. 4B. After the move-in, the first vacuum cup 80 is fully retracted to position the battery cell 40b for battery tab bending. Then, the first vacuum cup 80 shown and described in reference to FIG. 3A may be partially extended after creating the battery tab V-bend and thereby provide clearance to allow the die set 120 to move away after battery tab bending as shown in FIG. 5B.

Figure 6:
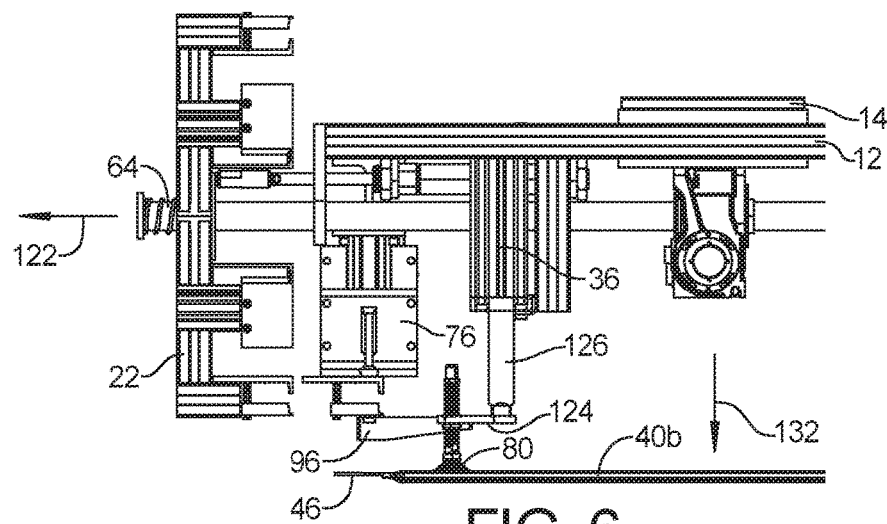
FIG. 6 is a side elevational view of an initial battery cell pick stage during operation the multi-tasking end effector system of FIG. 1.
Figure 7:
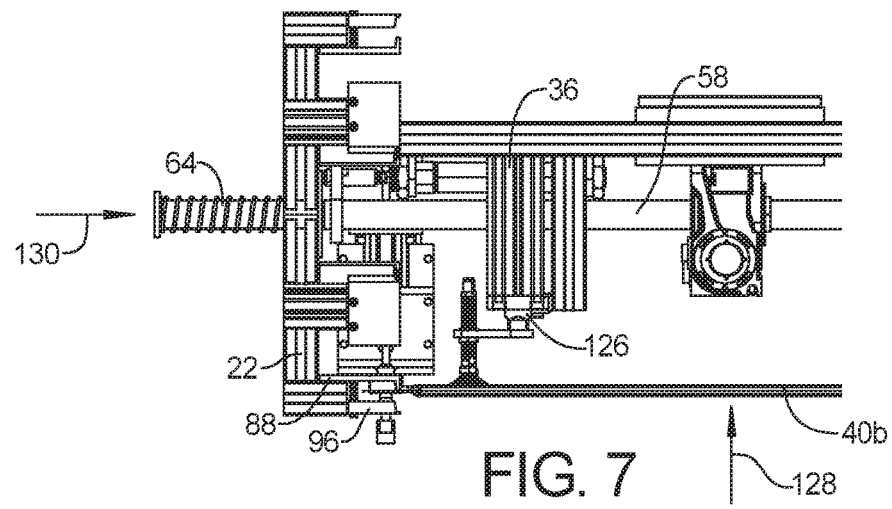
FIG. 7 is a side elevational view of a battery cell tab bending and test stage during operation the multi-tasking end effector system of FIG. 1.
Figure 8:
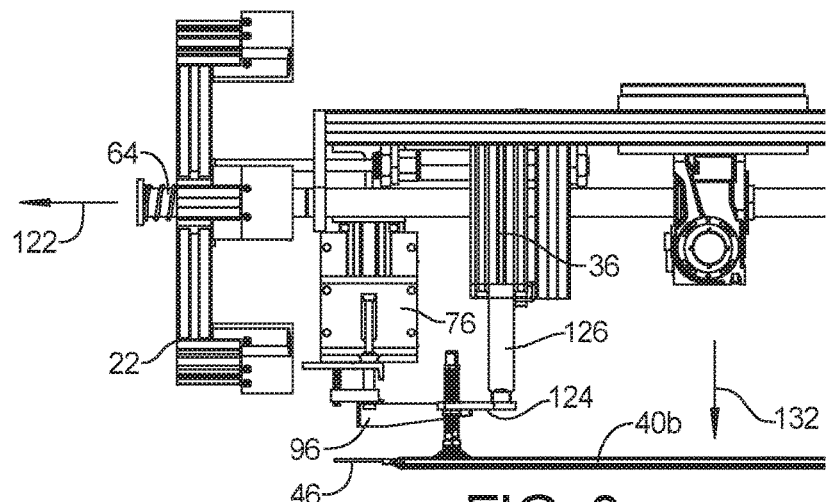
FIG. 8 is a side elevational view of a completed battery cell storage stage during operation the multi-tasking end effector system of FIG. 1.

Referring generally to FIGS. 6 through 8 and with continuing reference to FIGS. 1 through 5, an operational sequence of the multi-tasking end effector system 10 is presented for the exemplary battery cell 40b. With specific reference to FIG. 6, initially the die assembly 22 is displaced outwardly in an extending direction 122 by operation of the first wheel positioner 72 compressing the first compression spring 64. The swing arm 96 connected to the first tab-bending actuator 76 is rotated to provide clearance to receive the battery cell 40b. The robot arm 14 displaces the frame 12 to retrieve the battery cell 40b. The battery cell 40b is retrieved from the battery dunnage unit 42 by vacuum attachment using a pair of the vacuum cups such as the first vacuum cup 80 shown and the second vacuum cup 82 (not shown in this view). Each vacuum cup such as the first vacuum cup 80 is connected by a connecting bracket 124 to a piston 126 which in a fully extended position shown extends out of the first cell positioner 36 and then may be retracted into the first cell positioner 36 during retrieval of the battery cell 40b.

Referring to FIG. 7 and again to FIG. 6, the battery cell 40b is displaced in a retraction direction 128 toward the shaft 58 by fully or partially retracting, depending on the tab bending geometry of battery cells as mentioned before, the piston 126 into the first cell positioner 36. The die assembly 22 is then displaced inwardly in a retracting direction 130 opposite to the extending direction 122 by the retraction of the first wheel positioner 72 and by decompression forces of the first compression spring 64. After the move-in of the die assembly 22 and the die set 88 as well, the battery cell 40b is further displaced to the tab bending position by the first cell positioner 36 it the battery cell 40b was previously only partially retracted. Subsequently, a tab-bending actuator such as the first tab-bending actuator 76 is pneumatically actuated to close the die set 88 at a tab bending position. During tab bending, the swing arm 96 rotates from the swing arm release orientation 96a shown on a right side of FIG. 2 to the swing arm closed orientation 96b shown on the left side of FIG. 2, which acts to squeeze the die set 88 against the anvil 98 on the tab-bending actuator such as the first tab-bending actuator 76. As the cell tab 46 is being squeezed and bent by the die set 88, an OCV test is conducted simultaneously on the battery cell such as the battery cell 40b.

Referring to FIG. 8 and again to FIG. 7, after completion of the OCV testing and bending of the battery cell tabs, the swing arm 96 connected to the first tab-bending actuator 76 is rotated to the swing arm release orientation 96a and, simultaneously, the die set 88 is released to open automatically by the decompression of the spring-loaded guide pin 94 to provide clearance to release the battery cell 40b. For complex tab bending geometry including Z-bends, V- and inverted V-bends, the battery cell 40b is then displaced in a release direction 132 opposite to the retraction direction 128 away from the shaft 58 by partially extending the piston 126 outwardly from the first cell positioner 36. The die assembly 22, in turn, is again displaced outwardly in the extending direction 122 by operation of the first wheel positioner 72 compressing the first compression spring 64. Finally, the battery cell 40b is displaced in the release direction 132 opposite to the retraction direction 128 away from the shaft 58 by fully extending the piston 126 outwardly from the first cell positioner 36. The robot arm 14 then displaces the frame 12 to move the battery cell 40b to a desired installation location or a storage location and vacuum pressure is discharged to release the battery cell 40b from the vacuum cups. The robot arm 14 then displaces the frame 12, returning to the battery dunnage unit 42 to retrieve a next battery cell.

During the return trip to the end effector system 10, paired pin-wheel assemblies such as the third pin-wheel assembly 50 and the fourth pin-wheel assembly 52 are simultaneously indexed to a new angular position on-the-fly by operation of the index motor 60. This indexing positions a next tab-bending die set ready for a next battery cell to be retrieved from the dunnage unit 42.

Referring to FIG. 9 and again to FIG. 2, according to several aspects, an alternative aspect of the multi-tasking end effector system 10 is shown. It is noted that the multiple die assemblies of each pin-wheel assembly, such as a pin-wheel assembly 136 shown can be rotated in an axial rotation direction either clockwise or counterclockwise with respect to a shaft 138 about a shaft axis of rotation 140. Instead of two tab-bending actuators tending die assemblies similar to the die assemblies 22, 24, 26, 28, 30 and 32 previously discussed above, the pin-wheel assemblies such as the pin-wheel assembly 136 and an exemplary pin-wheel assembly 142 individually include a die assembly 144 built with an individual tab-bending actuator 146 as well as a die set 148 which has a fixed die 150 similar to an anvil on an actuator body 152 and a moving die 154 that can swing, then squeeze to bend the cell tab 46 against the fixed die 150. Upon completion of tab bending, the moving die 154 separates from and swings out and away from the fixed die 150 to release the cell tab 46 of the battery cell 40a for subsequent cell unloading operation. The compression springs 64, 68 and the wheel actuators 72, 74 are omitted from this aspect. This aspect also allows the pin-wheel assemblies and the index motor 60 (not shown in this view) to be located on a stand-alone device in a machine station to perform tab bending only.

Figure 9:
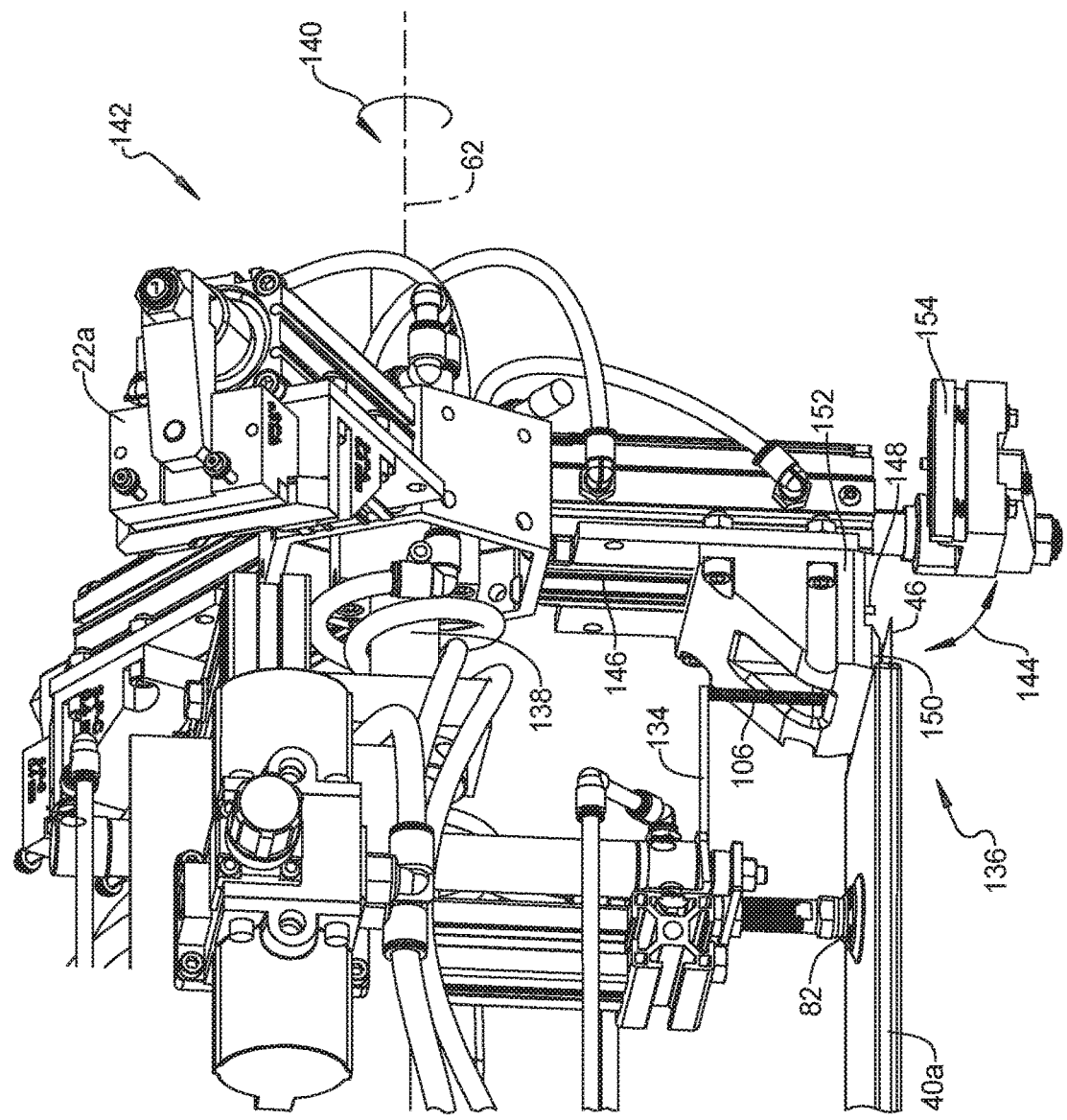
FIG. 9 is an end perspective view showing an alternative aspect for the multi-tasking end effector system of FIG. 1.

FIG. 9 further shows an alternative configuration of the OCV sensor 106 which may be mounted on the moving vacuum cup such as the second vacuum cup 82 and positioned proximate to the cell tab using an OCV sensor holder 134 for conducting the OCV check during battery cell loading and therefore prior to tab bending. The multiple die assemblies of each pin-wheel assembly, such as the pin-wheel assembly 136 shown when rotated in an axial rotation direction either clockwise or counterclockwise with respect to the shaft 138 about the shaft axis of rotation 140 permit any different ones of the multiple die assemblies which may provide different tab bending geometries with respect to each other to be selected without removing or adding die assemblies to a pin-wheel assembly.

A multi-tasking end effector system 10 of the present disclosure offers several advantages. The multi-tasking end effector system 10 combines the functions of battery cell loading/unloading, battery cell tab bending and battery cell open circuit voltage (OCV) testing all in one tool. All three tasks are performed while a robot is moving the multi-tasking end effector system 10 and the battery cell from one place to another. The multi-tasking end effector system 10 also provides multiple die assemblies with each pin-wheel assembly. This permits any different ones of the multiple die assemblies to be selected without removing or adding die assemblies to a pin-wheel assembly. Additional operations such as bar code reading of the battery cell 40 with a camera (not shown) can also be incorporated into the multi-tasking end effector system 10 as space permits.

The description of the present disclosure is merely exemplary in nature and variations that do not depart from the gist of the present disclosure are intended to be within the scope of the present disclosure. Such variations are not to be regarded as a departure from the spirit and scope of the present disclosure.

What is claimed is:

1. A multi-tasking end effector system, comprising:
 a base frame;
 a first pin-wheel assembly rotatably mounted on a first end of the base frame;
 a first die assembly mounted to the first pin-wheel assembly;
 a second pin-wheel assembly rotatably mounted on a second end of the base frame;
 a second die assembly mounted to the second pin-wheel assembly, and oriented in mirror image configuration with respect to the first die assembly; and
 first and second tab-bending actuators mounted to the base frame and operated to bend opposed cell tabs of a battery cell releasably positioned between the first pin-wheel assembly and the second pin-wheel assembly;
 wherein the first pin-wheel assembly and the second pin-wheel assembly individually include a tab-bending die set attached to a hub having a fixed die fastened to an arm structure of the hub and a matching moving die, and further including an open circuit voltage (OCV) sensor providing an open circuit voltage of the battery cell, the OCV sensor mounted to one of:
 the tab-bending die set to provide the open circuit voltage during bending of the opposed cell tabs; or
 on a vacuum cup and positioned proximate to one of the opposed cell tabs using an OCV sensor holder to provide the open circuit voltage during battery cell loading.

2. The multi-tasking end effector system of claim 1, further including:
 a third die assembly mounted to the first pin-wheel assembly; and
 a fourth die assembly mounted to the second pin-wheel assembly, with the third die assembly oriented in mirror image configuration with respect to the fourth die assembly.

3. The multi-tasking end effector system of claim 2, further including a shaft rotatably mounted to and connecting the first pin-wheel assembly and the second pin-wheel assembly.

4. The multi-tasking end effector system of claim 3, further including an index motor coupled to the shaft, the index motor rotating the shaft to co-rotate the die assemblies configured in mirror image configuration with respect to a shaft axis of rotation defining the first and second die assemblies and defining the third and fourth die assemblies.

5. The multi-tasking end effector system of claim 4, further including a first compression spring and a second compression spring positioned on the shaft and oppositely positioned with respect to the index motor, the first compression spring acting to bias the first pin-wheel assembly toward the index motor, and the second compression spring acting to bias the second pin-wheel assembly toward the index motor opposite to a direction of force applied by the first compression spring.

6. The multi-tasking end effector system of claim 1, further including a first cell positioner mounted to the base frame and positioned proximate to the first pin-wheel assembly, and a second cell positioner mounted to the base frame and positioned proximate to the second pin-wheel assembly.

7. The multi-tasking end effector system of claim 6, further including a first vacuum cup connected to the first cell positioner and a second vacuum cup connected to the second cell positioner, wherein when a partial vacuum pressure is applied the first vacuum cup and the second vacuum cup provide vacuum lifting capability to temporarily attach to and retain the battery cell.

8. The multi-tasking end effector system of claim 1, further including:
 a tab-bending actuator pneumatically actuated to open and close the tab-bending die set at a tab bending position;
 an anvil supported on the tab-bending actuator; and
 a swing arm, wherein to perform tab bending at the tab bending position, the swing arm rotates from a swing arm released orientation to a swing arm closed orientation acting to squeeze the tab-bending die set against the anvil.

9. The multi-tasking end effector system of claim 1, wherein the first pin-wheel assembly and the second pin-wheel assembly individually include a die assembly having an individual tab-bending actuator and a die set having a fixed die and a moving die that swings and then squeezes toward the fixed die to bend the opposed cell tabs against the fixed die, the moving die thereafter separating from and swinging out and away from the fixed die to release the cell tabs.

10. A multi-tasking end effector system, comprising:
a base frame connected to a robot arm of a robot;
a first shaft rotatably supported on the base frame;
a first pin-wheel assembly rotatably mounted to the first shaft at a first end of the base frame;
multiple first die assemblies mounted to the first pin-wheel assembly;
a second pin-wheel assembly rotatably mounted to the first shaft at a second end of the base frame;
multiple second die assemblies mounted to the second pin-wheel assembly, individually oriented in mirror image configuration with respect to one of the multiple first die assemblies;
a first index motor rotating the first shaft and co-rotating paired and mirror image configuration ones of the first die assemblies and the second die assemblies; and
first and second tab-bending actuators mounted to the base frame and operated to bend opposed cell tabs of a battery cell releasably positioned between the first pin-wheel assembly and the second pin-wheel assembly.

11. The multi-tasking end effector system of claim 10, further including:
a first die set connected to one of the first die assemblies;
a second die set connected to one of the second die assemblies; and
an open circuit voltage (OCV) sensor installed in the first die set and the second die set providing an open circuit voltage of the battery cell to be sensed during bending of the opposed cell tabs.

12. The multi-tasking end effector system of claim 11, further including:
a first tab-bending actuator pneumatically actuated to open or close the first die set at a first tab bending position; and
a second tab-bending actuator pneumatically actuated to open and close the second die set at a second tab bending position.

13. The multi-tasking end effector system of claim 10, further including:
a first cell positioner mounted to the base frame and positioned proximate to the first pin-wheel assembly;
a second cell positioner mounted to the base frame and positioned proximate to the second pin-wheel assembly; and
the first cell positioner having a first vacuum cup, and the second cell positioner having a second vacuum cup, the first vacuum cup and the second vacuum cup when contacting the battery cell and when applied with a partial vacuum pressure provide vacuum lifting capability to temporarily attach to and retain the battery cell.

14. The multi-tasking end effector system of claim 10, further including:
a first wheel positioner mounted to the base frame and positioned proximate to the first pin-wheel assembly and operating to linearly displace the first pin-wheel assembly; and
a second wheel positioner positioned proximate to the second pin-wheel assembly and operating to linearly displace the second pin-wheel assembly.

15. The multi-tasking end effector system of claim 10, further including:
a third pin-wheel assembly paired with a fourth pin-wheel assembly on a second shaft, the third pin-wheel assembly and the fourth pin-wheel assembly individually having multiple die assemblies; and
a second motor operated to rotate the second shaft, the third pin-wheel assembly and the fourth pin-wheel assembly.

16. The multi-tasking end effector system of claim 15, further including:
a fifth pin-wheel assembly paired with a sixth pin-wheel assembly on a third shaft, the fifth pin-wheel assembly and the sixth pin-wheel assembly individually having multiple die assemblies; and
a third motor operated to rotate the third shaft, the fifth pin-wheel assembly and the sixth pin-wheel assembly.

17. A multi-tasking end effector system, comprising:
a base frame connected to a robot arm of a robot using an adapter plate;
a shaft rotatably supported on the base frame;
a first pin-wheel assembly rotatably mounted to the shaft;
multiple first die assemblies mounted to the first pin-wheel assembly;
a second pin-wheel assembly rotatably mounted to the shaft;
multiple second die assemblies mounted to the second pin-wheel assembly and individually oriented in mirror image configuration with respect to one of the multiple first die assemblies;
a first index motor rotating the shaft and co-rotating paired and mirror image configuration ones of the first die assemblies and the second die assemblies;
a first three-position cell positioner mounted to the base frame and positioned proximate to the first pin-wheel assembly and providing for a battery cell retrieval/release from or to a storage unit, a battery cell partial positioning before or after tab bending and a battery cell full positioning for tab bending a first battery cell tab;
a second three-position cell positioner mounted to the base frame and positioned proximate to the second pin-wheel assembly and providing for the battery cell retrieval/release from or to the storage unit, the battery cell partial positioning before or after tab bending and the battery cell full positioning for tab bending a second battery cell tab; and
the first die assemblies and the second die assemblies individually including an open circuit voltage (OCV) sensor providing an open circuit voltage of the battery cell sensed during bending of the first battery cell tab and the second battery cell tab.

18. The multi-tasking end effector system of claim 17, further including:
a first tab-bending actuator mounted to the base frame and operated to bend the first battery cell tab of the battery cell when positioned between the first pin-wheel assembly and the second pin-wheel assembly; and
a second tab-bending actuator mounted to the base frame and operated to bend the second battery cell tab of the battery cell when positioned between the first pin-wheel assembly and the second pin-wheel assembly.

19. The multi-tasking end effector system of claim 17, wherein:
the first pin-wheel assembly is mounted to the shaft at a first end of the base frame; and the second pin-wheel assembly is mounted to the shaft at a second end of the base frame opposite to the first end.

* * * * *